United States Patent [19]

Doland, Sr. et al.

[11] Patent Number: 5,416,421
[45] Date of Patent: May 16, 1995

[54] TRAILER LAMP TESTING AND LAMP STORAGE APPARATUS

[76] Inventors: Russell A. Doland, Sr., 1 Beck Pl., Poughkeepsie, N.Y. 12601; Daniel A. Driscoll, 9 Espie Rd., Rhinebeck, N.Y. 12572

[21] Appl. No.: 194,006

[22] Filed: Feb. 9, 1994

[51] Int. Cl.$^6$ .................... G01R 31/02; G01R 1/04
[52] U.S. Cl. .................... 324/556; 324/504; 324/156; 340/642; D3/905
[58] Field of Search ............... 324/503, 504, 506, 507, 324/555, 556, 133, 156; 340/642; 206/216, 305, 419, 569, 573; D3/203, 284, 295, 905

[56] References Cited

U.S. PATENT DOCUMENTS

| | | | |
|---|---|---|---|
| 706,798 | 8/1902 | Chapman | 324/556 |
| 3,103,808 | 9/1963 | Eichelberger | 324/504 X |
| 3,428,888 | 2/1969 | Nolte | 324/504 |
| 3,663,939 | 5/1972 | Olsson | 324/504 X |
| 3,836,843 | 9/1974 | Yonce | 324/504 |
| 4,029,935 | 6/1977 | Archer et al. | 219/228 |
| 4,166,242 | 8/1979 | Spiteri | 324/504 |
| 4,176,315 | 11/1979 | Sunnarborg | 324/156 |
| 4,249,125 | 2/1981 | Carver | 324/504 |
| 4,547,722 | 10/1985 | Sarlo | 324/504 |
| 4,884,032 | 11/1989 | La Pensee | 324/504 |

*Primary Examiner*—Kenneth A. Wieder
*Assistant Examiner*—Diep Do

[57] ABSTRACT

A trailer lamp testing and lamp storage apparatus is provided for connecting to an electrical connector of a trailer, wherein the electrical connector of the trailer has a predetermined number of contacts for a predetermined number of lamp circuits in the trailer. The lamp testing and storage apparatus includes a housing assembly which includes a bottom housing portion, a hinge assembly connected to the bottom housing portion, and a lid assembly connected to the hinge assembly. A storage assembly, supported by the housing assembly, is provided for storing a number of replacement lamps for replacing burned out lamps in the trailer. The lamp testing and storage apparatus also includes a predetermined number of battery-powered testing circuits and a connector assembly for receiving respective ends of the predetermined number of testing circuits. A connector assembly supports and arranges the respective ends of the testing circuits such that they are placed in contact with corresponding electrical contacts in the electrical connector from the trailer. By this electrical contact, respective lamp circuits in the trailer are placed in series with corresponding testing circuits in the testing circuitry assembly, whereby respective lamps in the trailer are capable of being tested by the respective testing circuits in the testing circuit assembly. The storage assembly is supported by a floor portion of the bottom housing portion and includes a plurality of storage wells arrayed in rows and columns in a storage base.

5 Claims, 4 Drawing Sheets

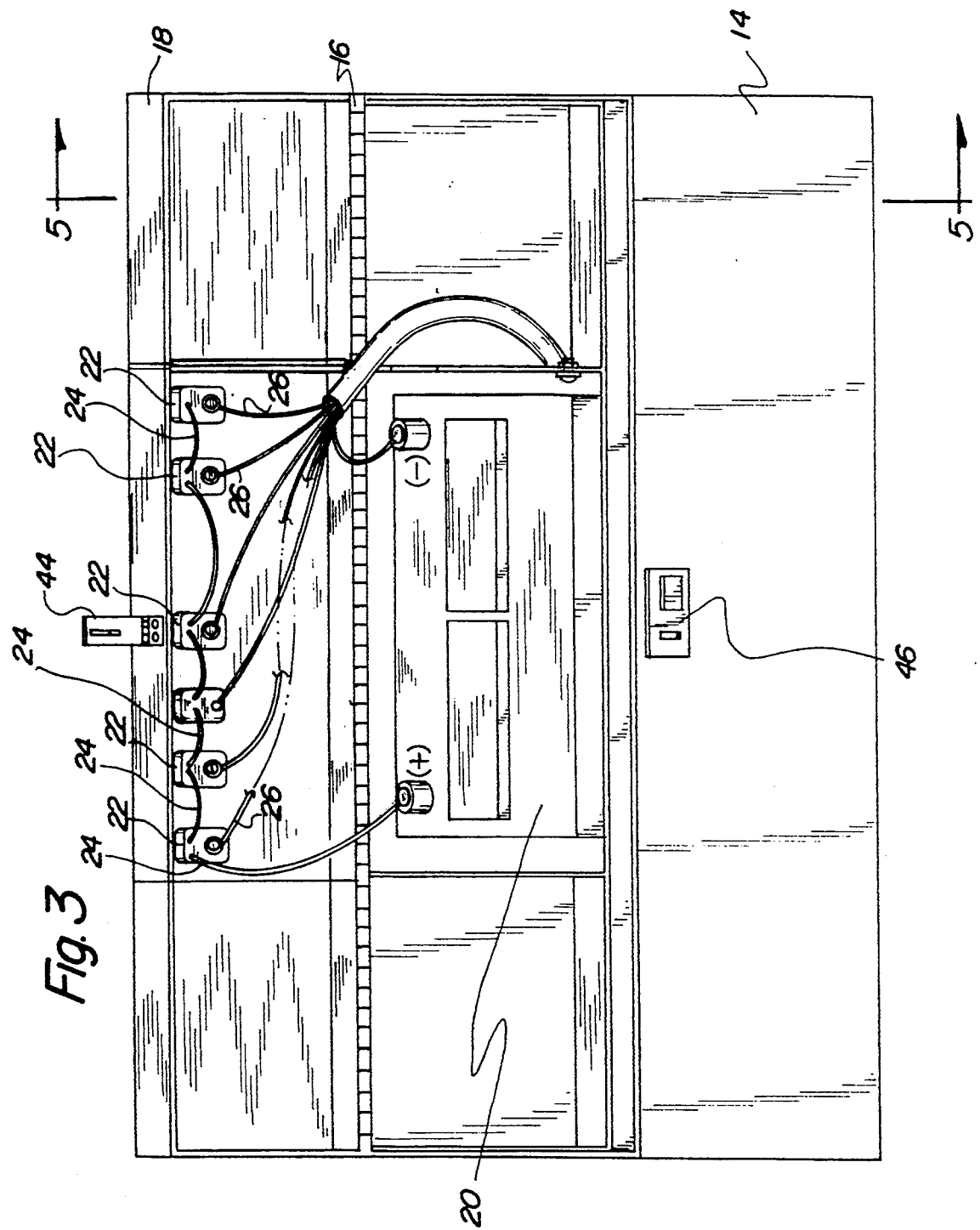

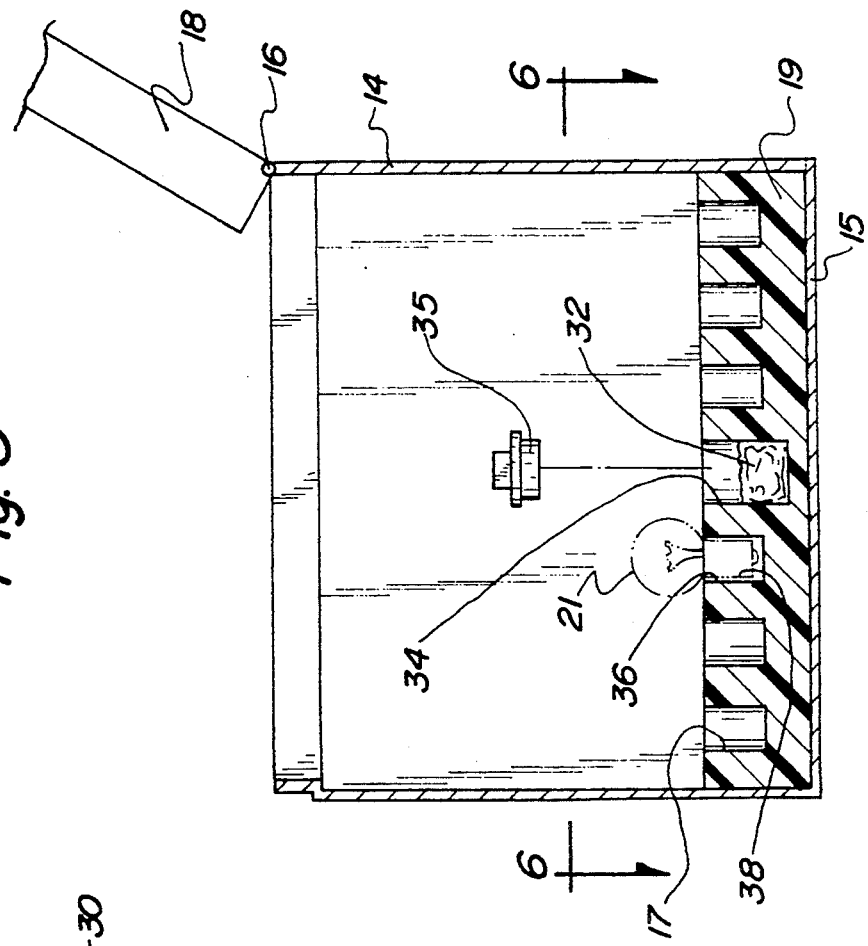
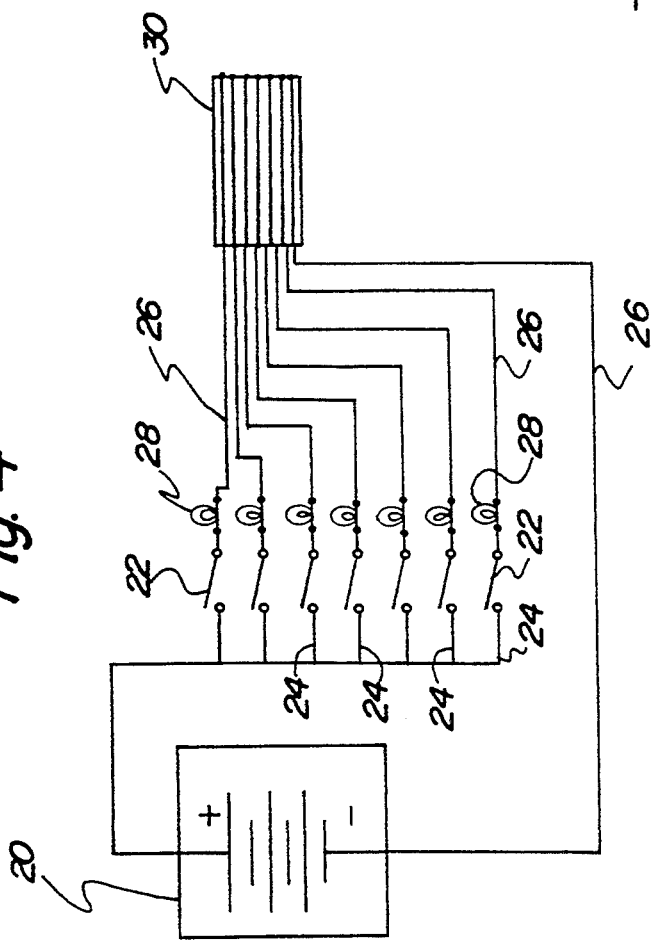

TRAILER LAMP TESTING AND LAMP STORAGE APPARATUS

BACKGROUND OF THE INVENTION

1. Field of the Invention

The present invention relates generally to testing devices for testing the continuity of lamp circuits and, more particularly, to devices especially adapted for testing the continuity of lamp circuits in trailers.

2. Description of the Prior Art

Tractor trailer combinations generally include a plurality of from, side, and rear lamps. The lamps on the trailer generally receive power from the tractor. The trailer lamps are in circuit with conductors and, generally, a standard 7-pin connector is used to connect the trailer conductors to a complementary connector on the tractor.

For purposes of safety and for conforming to law, the full complement of trailer lamps are tested prior to embarking on a journey. A basic approach to testing trailer lamps is for the truck driver to enter the tractor, start the motor, and back up the trailer while applying the brakes. Simply for the purpose of testing trailer lamps, this procedure is both time consuming and fuel consuming. In this respect, it would be desirable if a trailer lamp testing device were provided which does not require a tractor motor to be started up and does not require trailer to be backed up in order to test the trailer lamps.

When a fleet of tractor trailers must have their trailer lamps tested, the wasted time and expense of starting the respective tractor motors and backing up the respective trailers in the fleet are greatly multiplied. In this respect, it would be desirable if a trailer lamp testing device were provided that permits trailer lamps to be tested in a fleet of trailers in a manner that is much less consuming of time and expense than starting each individual tractor motor and backing up each individual trailer.

Throughout the years, a number of innovations have been developed relating to testing trailer lamp circuits, and the following U.S. patents are representative of some of those innovations: U.S. Pat. Nos. 3,836,843; 4,166,242; 4,249,125; 4,547,722; and 4,884,032.

More specifically, U.S. Pat. Nos. 3,836,843, 4,166,242, and 4,249,125 disclose devices for testing electrical circuits in tractors. Light emitting diodes (LEDs) are used and light up when specific tractor circuits exhibit continuity. The LEDs use power from the tractor when they are lit up. Moreover, the devices in these patents do not readily test trailer lamp circuitry if the trailer is disconnected from the tractor. In this respect, it would be desirable if a trailer lamp testing device were provided which did not use power from the tractor. Moreover, it would be desirable if a trailer lamp testing device can be employed when the trailer is disconnected from the tractor.

U.S. Pat. No. 4,547,722 discloses a test panel for tractor and trailer lights. The test panel has its own battery and a 7-pin connector. If a lamp is burned out, however, there is no provision with this device to provide a replacement lamp. In this respect, it would be desirable if a trailer lamp testing device were provided which stores a number of replacement lamps to facilitate replacement of a lamp that is discovered to be burned out as a result of carrying out a test.

U.S. Pat. No. 4,884,032 discloses a trailer/tractor light testing system which includes its own battery to permit testing of the trailer lamps with the tractor being connected to the trailer. A circular selector switch is provided that enables testing of one lamp circuit at a time. Testing of one lamp circuit at a time has a distinct disadvantage. One may go through a sequence of tests and forget the result of preceding tests. In this respect, it would be desirable if a trailer lamp testing device were provided which provided testing of all the lamp circuits simultaneously.

Still other features would be desirable in a trailer lamp testing and lamp storage apparatus. For example, although a 7-pin connector is substantially standardized, there may be other connectors that have different numbers of pins. There is currently under development a 13-pin connector that can be used for "smart" trailers which have computerized subsystems in the trailer. In this respect, it would be desirable if a trailer lamp testing device were provided that is adaptable to 13-pin connectors for testing the circuits served by the 13-pin connector.

As stated above, it would be desirable if a trailer lamp testing apparatus also included a lamp storage portion to facilitate replacement of burned out lamps. Replacement lamps must make good electrical contact for the lamps to function properly. In environments subjected to wide temperature ranges in which metal electrical contacts expand and contract, metal contacts are often provided with pasty conductive material to facilitate electrical contact between metal contacts. In this respect, it would be desirable if a trailer lamp testing and lamp storage device were provided which included a supply of a pasty electrical conductive material so that the metal contacts on the lamps can be provided with the electrically conductive paste.

Another inhibitor of good electrical contact is the present of metal oxide particles or metal oxide films covering a base metal. The oxides are relatively non-conductive compared to the base metal. One way of removing metal oxides from base metals is to use an abrasive to abrade away the metal oxide. In this respect, it would be desirable if a trailer lamp testing and lamp storage device were provided which included a quantity of an abrasive material for removing metal oxide films from base metal on lamp contacts.

When storing a plurality of replacement lamps, an organized manner of storage is preferred over a random disorganized conglomeration of different lamps. In this respect, it would be desirable if a trailer lamp testing and storage device were provided which includes an organized arrangement for storing replacement lamps.

Thus, while the foregoing body of prior art indicates it to be well known to use testing devices for trailer lamps, the prior art described above does not teach or suggest a trailer lamp testing and lamp storage apparatus which has the following combination of desirable features: (1) does not require a tractor motor to be started up and does not require trailer to be backed up in order to test the trailer lamps; (2) permits trailer lamps to be tested in a fleet of trailers in a manner that is much less time consuming and expensive than starting each individual tractor motor and backing up each individual trailer; (3) does not use power from the tractor; (4) can be employed when the trailer is disconnected from the tractor; (5) stores a number of replacement lamps to facilitate replacement of a lamp that is discovered to be burned out as a result of carrying out a test;

(6) provides testing of all the lamp circuits simultaneously; (7) is adaptable to 13-pin connectors for testing the circuits served by the 13-pin connector; (8) includes a supply of a pasty electrically conductive material so that the metal contacts on the lamps can be provided with a quantity of electrically conductive paste; (9) includes a quantity of an abrasive material for removing metal oxide films from base metal on lamp contacts; and (10) includes an organized arrangement for storing replacement lamps. The foregoing desired characteristics are provided by the unique trailer lamp testing and lamp storage apparatus of the present invention as will be made apparent from the following description thereof. Other advantages of the present invention over the prior art also will be rendered evident.

SUMMARY OF THE INVENTION

To achieve the foregoing and other advantages, the present invention, briefly described, provides a new and improved trailer lamp testing and lamp storage apparatus which is connected to an electrical connector of a trailer, wherein the electrical connector of the trailer has a predetermined number of contacts for a predetermined number of lamp circuits in the trailer. The lamp testing and storage apparatus includes a housing assembly which includes a bottom housing portion, a hinge assembly connected to the bottom housing portion, and a lid assembly connected to the hinge assembly. A storage assembly, supported by the housing assembly, is provided for storing a number of replacement lamps for replacing burned out trailer lamps. The lamp testing and storage apparatus also includes a testing circuitry assembly which includes a predetermined number of testing circuits and a connector assembly for receiving respective ends of the predetermined number of testing circuits. The connector assembly supports and arranges the respective ends of the testing circuits such that they are placed in contact with corresponding electrical contacts in the electrical connector in the trailer. By this electrical contact, respective lamp circuits in the trailer are placed in series with corresponding testing circuits in the testing circuitry assembly, whereby respective lamps in the trailer are capable of being tested by the respective testing circuits in the testing circuit assembly.

The storage assembly is supported by a floor portion of the bottom housing portion, and the storage assembly includes a plurality of storage wells arrayed in a storage base. The storage wells are arrayed in the storage base in an arrangement of rows and columns.

The testing circuit assembly includes a battery power source housed within the housing assembly. A predetermined number of testing circuits are connected in parallel with the battery power source. The predetermined number of testing circuits includes a predetermined number of first conductors connected in parallel to the battery power source. A predetermined number of selector switch assemblies are connected in series with the respective first conductors. A predetermined number of indicator light assemblies are connected in series with the respective selector switch assemblies. A predetermined number of second conductors are connected in series with the respective indicator light assemblies. The selector switch assemblies have two modes of operation: a testing mode; and a nontesting mode. When the selector switch assemblies are in an open circuit condition, they are in a nontesting mode. When the selector switch assemblies are in a closed circuit position, the selector switch assemblies are in a testing mode.

The connector assembly receives respective ends of the predetermined number of second conductors. The connector assembly supports and arrays the ends of the second conductors such that they are placed in contact with corresponding electrical contacts in the electrical connector for the trailer. In this way, respective lamp circuits in the trailer are placed in series with the corresponding respective testing circuits in the testing circuitry assembly, whereby lamps in the trailer are capable of being tested by the testing circuit assembly.

A quantity of electrically conductive paste is supported by the housing assembly. More specifically, the electrically conductive paste is supported by the storage assembly. A quantity of an abrasive material is supported by the housing assembly. More specifically, the abrasive material is in the form of a sheet of sandpaper lining a well in a storage base portion of a storage assembly supported on a floor portion of a storage assembly.

The testing circuitry assembly may be housed in the lid assembly of the housing assembly, and the storage assembly may be housed in the bottom housing portion of the housing assembly. A handle assembly attached to the lid assembly of the housing assembly. A lock assembly is provided for locking the lid assembly in a closed orientation with respect to the bottom housing portion.

The above brief description sets forth rather broadly the more important features of the present invention in order that the detailed description thereof that follows may be better understood, and in order that the present contributions to the art may be better appreciated. There are, of course, additional features of the invention that will be described hereinafter and which will be for the subject matter of the claims appended hereto.

In this respect, before explaining a preferred embodiment of the invention in detail, it is understood that the invention is not limited in its application to the details of the construction and to the arrangements of the components set forth in the following description or illustrated in the drawings. The invention is capable of other embodiments and of being practiced and carried out in various ways. Also, it is to be understood, that the phraseology and terminology employed herein are for the purpose of description and should not be regarded as limiting.

As such, those skilled in the art will appreciate that the conception, upon which disclosure is based, may readily be utilized as a basis for designing other structures, methods, and systems for carrying out the several purposes of the present invention. It is important, therefore, that the claims be regarded as including such equivalent constructions insofar as they do not depart from the spirit and scope of the present invention.

Further, the purpose of the foregoing Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. Accordingly, the Abstract is neither intended to define the invention or the application, which only is measured by the claims, nor is it intended to be limiting as to the scope of the invention in any way.

It is therefore an object of the present invention to provide a new and improved trailer lamp testing and lamp storage apparatus which has all of the advantages of the prior art and none of the disadvantages.

It is another object of the present invention to provide a new and improved trailer lamp testing and lamp storage apparatus which may be easily and efficiently manufactured and marketed.

It is a further object of the present invention to provide a new and improved trailer lamp testing and lamp storage apparatus which is of durable and reliable construction.

An even further object of the present invention is to provide a new and improved trailer lamp testing and lamp storage apparatus which is susceptible of a low cost of manufacture with regard to both materials and labor, and which accordingly is then susceptible of low prices of sale to the consuming public, thereby making such trailer lamp testing and lamp storage apparatus available to the buying public.

Still yet a further object of the present invention is to provide a new and improved trailer lamp testing and lamp storage apparatus which does not require a tractor motor to be started up and does not require trailer to be backed up in order to test the trailer lamps.

Still another object of the present invention is to provide a new and improved trailer lamp testing and lamp storage apparatus that permits trailer lamps to be tested in a fleet of trailers in a manner that is much less time consuming and expensive than starting each individual tractor motor and backing up each individual trailer.

Yet another object of the present invention is to provide a new and improved trailer lamp testing and lamp storage apparatus which does not use power from the tractor.

Even another object of the present invention is to provide a new and improved trailer lamp testing and lamp storage apparatus that can be employed when the trailer is disconnected from the tractor.

Still a further object of the present invention is to provide a new and improved trailer lamp testing and lamp storage apparatus which stores a number of replacement lamps to facilitate replacement of a lamp that is discovered to be burned out as a result of carrying out a test.

Yet another object of the present invention is to provide a new and improved trailer lamp testing and lamp storage apparatus that provides testing of all the lamp circuits simultaneously.

Still another object of the present invention is to provide a new and improved trailer lamp testing and lamp storage apparatus which is adaptable to 13-pin connectors for testing the circuits served by the 13-pin connector.

Yet another object of the present invention is to provide a new and improved trailer lamp testing and lamp storage apparatus that includes a supply of a pasty electrically conductive material so that the metal contacts on the lamps can be provided with a quantity of electrically conductive paste.

Still a further object of the present invention is to provide a new and improved trailer lamp testing and lamp storage apparatus that includes a quantity of an abrasive material for removing metal oxide films from base metal on lamp contacts.

Yet another object of the present invention is to provide a new and improved trailer lamp testing and lamp storage apparatus which includes an organized arrangement for storing replacement lamps.

These together with still other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there are illustrated preferred embodiments of the invention.

BRIEF DESCRIPTION OF THE DRAWINGS

The invention will be better understood and the above objects as well as objects other than those set forth above will become more apparent after a study of the following detailed description thereof. Such description makes reference to the annexed drawing wherein:

FIG. 3 is an enlarged frontal view of the embodiment of the trailer lamp testing and lamp storage apparatus of FIG. 1 with the hinged lid open.

FIG. 4 is an electrical circuit diagram for the electrical circuitry used with the embodiment of the invention shown in FIG. 1.

FIG. 5 is a partial cross-sectional view of the embodiment of the invention shown in FIG. 3 taken along line 5—5 of FIG. 3; this view illustrates an organized arrangement for storing replacement lamps, illustrates a retainer for a quantity of an electrically conductive paste, and illustrates a well containing a sheet of abrasive material.

DESCRIPTION OF THE PREFERRED EMBODIMENT

Figure 1:
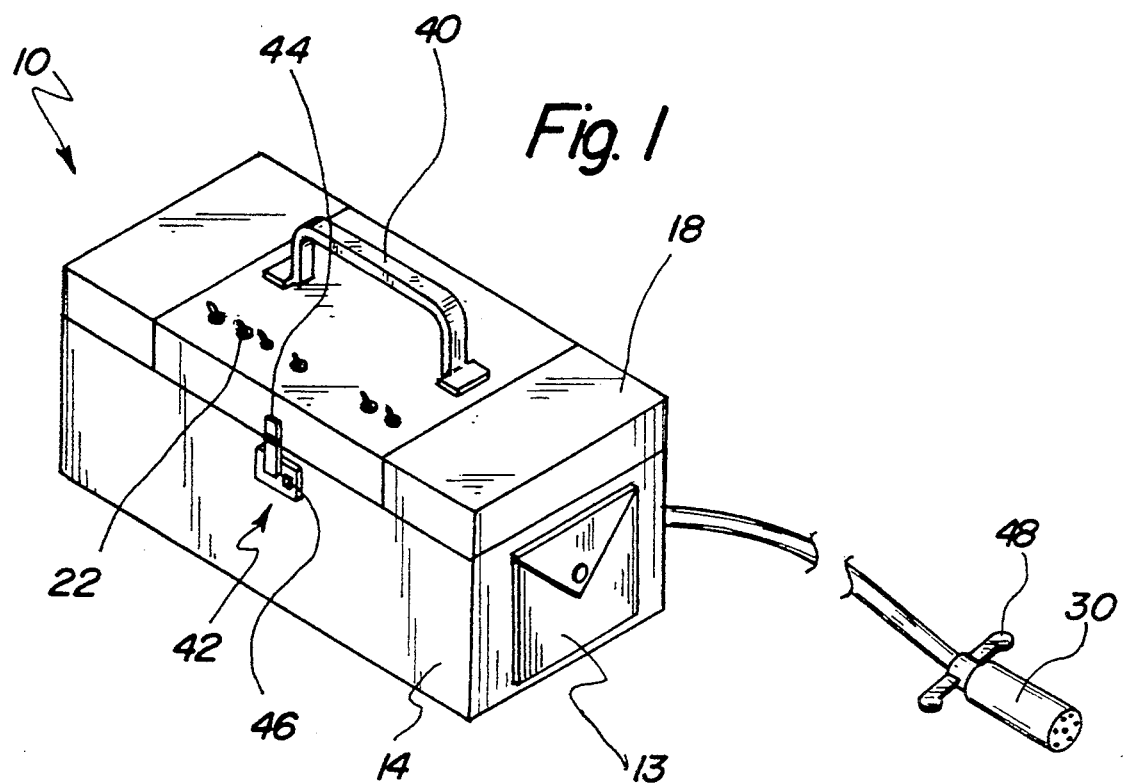
FIG. 1 is a perspective view showing a preferred embodiment of the trailer lamp testing and lamp storage apparatus of the invention with a hinged lid closed.

With reference to the drawings, a new and improved trailer lamp testing and lamp storage apparatus embodying the principles and concepts of the present invention will be described.

All the Figures illustrate a first preferred embodiment of the trailer lamp testing and lamp storage apparatus of the invention generally designated by reference numeral 10. In its preferred form, trailer lamp testing and lamp storage apparatus 10 is provided for connecting to an electrical connector of a trailer wherein the electrical connector has a predetermined number of contacts for a predetermined number of lamp circuits in the trailer.

Figure 2:
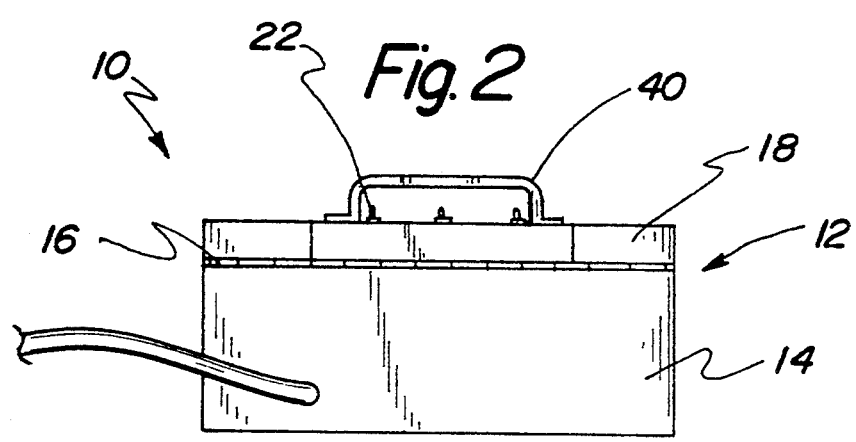
FIG. 2 is a rear view of the embodiment of the trailer lamp testing and lamp storage apparatus of the invention shown in FIG. 1.

As shown in FIGS. 1-3, the lamp testing and storage apparatus includes a housing assembly 12 which includes a bottom housing portion 14, a hinge assembly 16 connected to the bottom housing portion 14, and a lid assembly 18 connected to the hinge assembly 16. A storage assembly 13, supported by the housing assembly 12, is provided for storing a number of replacement lamps 21 which are used to replaced burned out lamps in the trailer.

Also with reference to FIG. 4, the lamp testing and storage apparatus also includes a testing circuitry assembly which includes a predetermined number of testing circuits and a connector assembly 30 for receiving respective ends of the predetermined number of testing circuits. The connector assembly 30 supports and arranges the respective ends of the testing circuits such that they are placed in contact with corresponding electrical contacts in the electrical connector in the trailer. By this electrical contact, respective lamp circuits in the trailer are placed in series with corresponding testing circuits in the testing circuitry assembly, whereby respective lamps in the trailer are capable of being tested by the respective testing circuits in the testing circuit assembly.

As shown in FIG. 1, the storage assembly 13 can be in the form of a pocket or pouch attached to a side wall of the housing assembly 12. Also, a handle portion 48 can be associated with the connector assembly 30 for facilitating connection and separation of the connector assembly 30 to the connector of the trailer.

Figure 6:
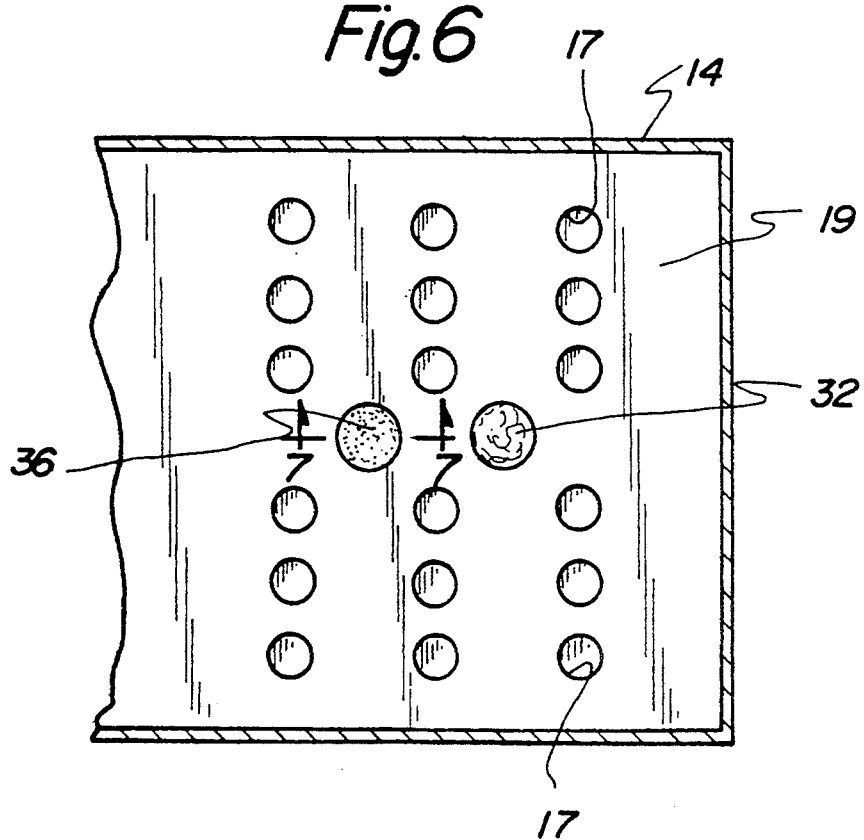
FIG. 6 is a top view of the embodiment of the invention shown in FIG. 5 taken along line 6—6 of FIG. 5.

As shown in FIGS. 5 and 6, the storage assembly 13 is supported by a floor portion 15 of the bottom housing portion 14, and the storage assembly 13 includes a plurality of storage wells 17 arrayed in a storage base 19. Individual replacement lamps 21 are stored in individual storage wells 17 in the storage base 19 of the storage assembly 13. The storage wells 17 are arrayed in the storage base 19 in an arrangement of rows and columns.

As shown in FIGS. 3 and 4, The testing circuit assembly includes a battery power source 20 housed within the housing assembly 12. A predetermined number of testing circuits are connected in parallel with the battery power source 20. The predetermined number of testing circuits includes a predetermined number of first conductors 24 connected in parallel to the battery power source 20. A predetermined number of selector switch assemblies 22 are connected in series with the respective first conductors 24. A predetermined number of indicator light assemblies 28 are connected in series with the respective selector switch assemblies 22. A predetermined number of second conductors 26 are connected in series with the respective indicator light assemblies 28. The selector switch assemblies 22 have two modes of operation: a testing mode; and a nontesting mode. When the selector switch assemblies 22 are in an open circuit condition, they are in a nontesting mode. When the selector switch assemblies 22 are in a closed circuit position, the selector switch assemblies 22 are in a testing mode.

The connector assembly 30 receives respective ends of the predetermined number of second conductors 26. The connector assembly 30 supports and arrays the ends of the second conductors 26 such that they are placed in contact with corresponding electrical contacts in the electrical connector for the trailer. In this way, respective lamp circuits in the trailer are placed in series with the corresponding respective testing circuits in the testing circuitry assembly, whereby lamps in the trailer are capable of being tested by the testing circuit assembly. When the lamps in the trailer have electrical continuity, that is their filaments are intact, the respective indicator light assemblies 28 light up for the respective testing circuits selected by the respective selector switch assemblies 22. On the other hand, if the trailer lamp filament is broken, resulting in a situation wherein the trailer lamp will not light, then the corresponding indicator light assembly 28 will not light even though the respective selector switch assembly 22 has been switched to a testing mode. The failure of the respective indicator light assembly 28 to light indicates that there is electrical discontinuity in the corresponding trailer lamp circuit.

Referring to FIGS. 5 and 6, a quantity of electrically conductive paste 32 is supported by the housing assembly 12. More specifically, the electrically conductive paste 32 is supported by the storage assembly 13. The electrically conductive paste 32 is stored in a well 34 stored in the storage base 19 of the storage assembly 13. The well 34 is provided with a cap 35 for retaining the electrically conductive paste 32 in the well 34.

Figure 7:
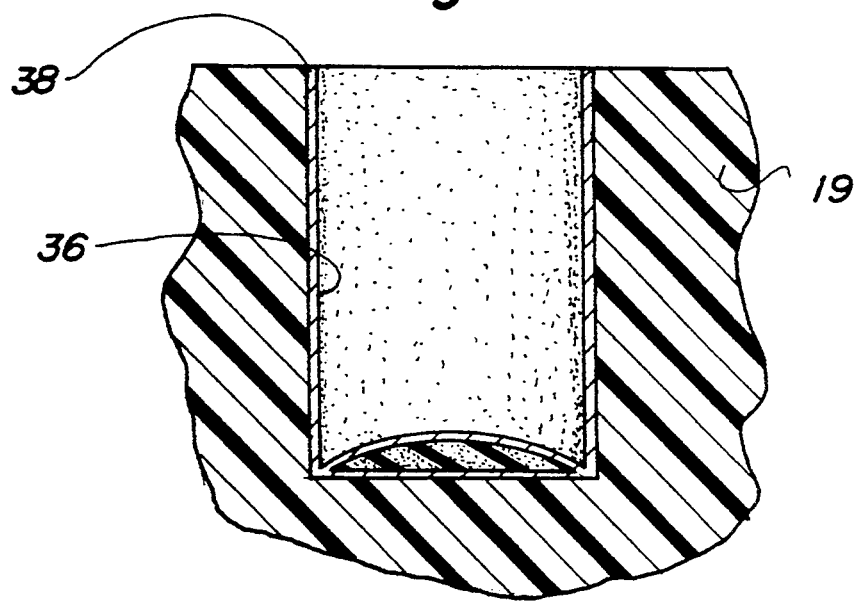
FIG. 7 is an enlarged cross-sectional view of the abrasive well in the embodiment of the invention shown in FIG. 6 taken along line 7—7 thereof.

Referring to FIGS. 5, 6, and 7, quantity of an abrasive material 36 is supported by the housing assembly 12. More specifically, the abrasive material 36 is in the form of a sheet of sandpaper lining a well 38 in a storage base portion 19 of a storage assembly 13 supported on a floor portion 15 of a storage assembly 13.

As shown in FIG. 1, 2, and 3, the testing circuitry assembly is housed in the lid assembly 18 of the housing assembly 12, and (as shown in FIGS. 5 and 6) the storage assembly 13 is housed in the bottom housing portion 14 of the housing assembly 12.

As shown in FIGS. 1, 2, and 3, a handle assembly 40 attached to the lid assembly 18 of the housing assembly 12.

As shown in FIGS. 1 and 3, a lock assembly 42 is provided for locking the lid assembly 18 in a closed orientations with respect to the bottom housing portion 14. A first lock assembly portion 44 is attached to the lid assembly 18, and a second lock assembly portion 46 is attached to the bottom housing portion 14. A key or padlock can be used to lock the first lock assembly portion 44 and the second lock assembly portion 46 together.

From the description above, it is clear that the trailer lamp testing and lamp storage apparatus 10 of the invention is a portable, self-contained, battery-powered testing unit that can be carried to a site where a fleet of trailers are present and can be used to test each of the trailers in succession without starting the motors of the corresponding tractors.

If the trailers are connected to the tractors, then the electrical connection between the trailer and the tractor is first separated, and the trailer lamp testing and lamp storage apparatus of the invention is connected to the connector from the trailer. After the tests have been made, the connector of the trailer is reconnected to the connector from the tractor.

If the trailers are not connected to the tractors, then the trailer lamp testing and lamp storage apparatus of the invention is connected directly to the connector of the trailer.

The components of the trailer lamp testing and lamp storage apparatus of the invention can be made from inexpensive and durable metal and plastic materials.

As to the manner of usage and operation of the instant invention, the same is apparent from the above disclosure, and accordingly, no further discussion relative to the manner of usage and operation need be provided.

It is apparent from the above that the present invention accomplishes all of the objects set forth by providing a new and improved trailer lamp testing and lamp storage apparatus that is low in cost, relatively simple in design and operation, and which may advantageously be used to test trailer lamps without requiring a tractor motor to be started up and without requiring a trailer to be backed up in order to test the trailer lamps. With the invention, a trailer lamp testing and lamp storage apparatus is provided which permits trailer lamps to be tested in a fleet of trailers in a manner that is much less time consuming and expensive than starting each individual tractor motor and backing up each individual trailer. With the invention, a trailer lamp testing and lamp storage apparatus is provided which does not use power from the tractor. With the invention, a trailer lamp testing and lamp storage apparatus is provided which can be employed when the trailer is disconnected from the tractor. With the invention, a trailer lamp testing and lamp storage apparatus is provided which stores a number of replacement lamps to facilitate replacement of a lamp that is discovered to be burned out as a result of carrying out a test. With the invention, a trailer lamp testing and lamp storage apparatus is provided which provides testing of all the lamp circuits simultaneously. With the invention, a trailer lamp testing and lamp storage apparatus is provided which is adaptable to -pin connectors for testing the circuits served by the -pin connector. With the invention, a trailer lamp testing and lamp storage apparatus is provided which includes a supply of a pasty electrically conductive material so that the metal contacts on the lamps can be provided with a quantity of electrically conductive paste. With the invention, a trailer lamp testing and lamp storage apparatus is provided which includes a quantity of an abrasive material for removing metal oxide films from base metal on lamp contacts. With the invention, a trailer lamp testing and lamp storage apparatus is provided which includes an organized arrangement for storing replacement lamps.

With respect to the above description, it should be realized that the optimum dimensional relationships for the parts of the invention, to include variations in size, form function and manner of operation, assembly and use, are deemed readily apparent and obvious to those skilled in the art, and therefore, all relationships equivalent to those illustrated in the drawings and described in the specification are intended to be encompassed only by the scope of appended claims.

While the present invention has been shown in the drawings and fully described above with particularity and detail in connection with what is presently deemed to be the most practical and preferred embodiments of the invention, it will be apparent to those of ordinary skill in the art that many modifications thereof may be made without departing from the principles and concepts set forth herein. Hence, the proper scope of the present invention should be determined only by the broadest interpretation of the appended claims so as to encompass all such modifications and equivalents.

What is claimed as being new and desired to be protected by Letters Patent of the United States is as follows:

1. A trailer lamp testing and lamp storage apparatus for connecting to an electrical connector of a trailer having a predetermined number of contacts for a predetermined number of lamp circuits in the trailer, said apparatus comprising:
   a housing assembly which includes a bottom housing portion, a hinge assembly connected to said bottom housing portion, and a lid assembly connected to said hinge assembly,
   a storage assembly, supported by said housing assembly, for storing a plurality of replacement lamps,
   a testing circuitry assembly, supported by said housing assembly, which includes a predetermined number of testing circuits, each of said testing circuits including a respective end, and
   a connector assembly for receiving respective ends of said predetermined number of testing circuits, said connector assembly supporting and arraying said respective ends of said testing circuits such that they are placed in contact with corresponding electrical contacts in the electrical connector in the trailer, such that respective lamp circuits in the trailer are placed in series with said respective testing circuits in said testing circuitry assembly, whereby respective lamps in the trailer are capable of being tested by said testing circuits in said testing circuit assembly,
   wherein said storage assembly is supported by a floor portion of said bottom housing portion., and said storage assembly includes a plurality of storage wells arrayed in a storage base, wherein said storage wells are arrayed in said storage base in an arrangement of rows and columns, and
   wherein said testing circuitry assembly is housed in said lid assembly of said housing assembly, and wherein said storage assembly is housed in said bottom housing portion of said housing assembly.

2. The apparatus described in claim 1 wherein said testing circuit assembly includes:
   a battery power source housed within said housing assembly, and
   a predetermined number of testing circuits connected in parallel with said battery power source.

3. The apparatus described in claim 1 wherein said predetermined number of testing circuits include:
   a predetermined number of first conductors connected in parallel to said battery power source,
   a predetermined number of selector switch assemblies connected in series with said respective first conductors,
   a predetermined number of indicator light assemblies connected in series with said respective selector switch assemblies, and
   a predetermined number of second conductors connected in series with said respective indicator light assemblies,
   wherein said connector assembly receives respective ends of said predetermined number of second conductors, said connector assembly supporting and arraying said ends of said second conductors such that they are placed in contact with corresponding electrical contacts in the electrical connector in the trailer, such that respective lamp circuits in the trailer are placed in series with respective testing circuits in said testing circuitry assembly,
   whereby lamps in the trailer are capable of being tested by said testing circuit assembly.

4. The apparatus described in claim 1, further including:
   a handle assembly attached to said lid assembly of said housing assembly.

5. The apparatus described in claim 1, further including:
   a lock assembly for locking said lid assembly in a closed orientations with respect to said bottom housing portion.

* * * * *